(12) United States Patent
Kim

(10) Patent No.: US 12,300,149 B2
(45) Date of Patent: May 13, 2025

(54) DISPLAY PANEL DRIVER AND DISPLAY DEVICE INCLUDING THE SAME

(71) Applicant: Samsung Display Co., Ltd., Yongin-si (KR)

(72) Inventor: Gigeun Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/508,507

(22) Filed: Nov. 14, 2023

(65) Prior Publication Data

US 2024/0249663 A1     Jul. 25, 2024

(30) Foreign Application Priority Data

Jan. 25, 2023   (KR) .................. 10-2023-0009299

(51) Int. Cl.
| G09G 3/30 | (2006.01) |
| G09G 3/32 | (2016.01) |
| G09G 3/3208 | (2016.01) |
| G09G 3/3258 | (2016.01) |
| H10K 59/12 | (2023.01) |

(52) U.S. Cl.
CPC .................. *G09G 3/30* (2013.01); *G09G 3/32* (2013.01); *G09G 3/3208* (2013.01); *G09G 3/3258* (2013.01); *G09G 2310/0294* (2013.01); *G09G 2320/0233* (2013.01); *G09G 2320/043* (2013.01); *G09G 2320/045* (2013.01); *G09G 2330/021* (2013.01);

(Continued)

(58) Field of Classification Search
CPC ............. G09G 3/30; G09G 2310/0294; G09G 2320/045; G09G 2360/148; G09G 3/3208; G09G 3/32; G09G 3/3258; G09G 2320/0233; G09G 2320/043; G09G 2330/021; G09G 2340/0435; G09G 2360/16; H10K 59/12
See application file for complete search history.

(56) References Cited

U.S. PATENT DOCUMENTS

| 7,675,492 B2 | 3/2010 | Park et al. |
| 9,928,773 B2 * | 3/2018 | Kim ..................... G09G 3/3233 |

(Continued)

FOREIGN PATENT DOCUMENTS

| KR | 20170109135 A | 9/2017 |
| KR | 20180042506 A | 4/2018 |

(Continued)

*Primary Examiner* — Douglas M Wilson
(74) *Attorney, Agent, or Firm* — CANTOR COLBURN LLP

(57) ABSTRACT

A display panel driver which drives a display panel includes a compensator configured to generate a data signal by compensating for input image data based on deterioration data, a sampler configured to generate, when a first display region of the display panel is scanned at a first driving frequency and when a second display region of the display panel is scanned at a second driving frequency that is less than the first driving frequency, a data signal corresponding to a sampling pixel by sampling the data signal at a sampling frequency that is less than or equal to the second driving frequency, and an accumulator configured to generate the deterioration data by accumulating the data signal corresponding to the sampling pixel.

20 Claims, 17 Drawing Sheets

(52) U.S. Cl.
CPC ............... *G09G 2340/0435* (2013.01); *G09G 2360/148* (2013.01); *G09G 2360/16* (2013.01); *H10K 59/12* (2023.02)

(56) References Cited

U.S. PATENT DOCUMENTS

| | | | |
|---|---|---|---|
| 11,244,612 B2* | 2/2022 | Ok | G09G 3/3233 |
| 2016/0379551 A1* | 12/2016 | Zhuang | G09G 3/3208 |
| | | | 345/520 |
| 2024/0331638 A1* | 10/2024 | Xie | G09G 3/3233 |

FOREIGN PATENT DOCUMENTS

| | | |
|---|---|---|
| KR | 20210101437 A | 8/2021 |
| KR | 20220079368 A | 6/2022 |

* cited by examiner

DISPLAY PANEL DRIVER AND DISPLAY DEVICE INCLUDING THE SAME

This application claims priority to Korean Patent Application No. 10-2023-0009299, filed on Jan. 25, 2023, and all the benefits accruing therefrom under 35 USC § 119, the content of which in its entirety is herein incorporated by reference.

BACKGROUND

1. Field

Embodiments of the invention relate to a display panel driver and a display device. More particularly, embodiments of the invention relate to a display panel driver and a display device to which a multi-frequency driving technology is applied.

2. Description of the Related Art

In general, a display device may include a display panel, a gate driver, a data driver, and a timing controller. The display panel may include a plurality of gate lines, a plurality of data lines, and a plurality of pixels electrically connected to the gate lines and the data lines. The gate driver may provide gate signals to the gate lines, the data driver may provide data voltages to the data lines, and the timing controller may control the gate driver and the data driver.

Recently, power consumption of the display device has been required to be reduced, and the power consumption of the display device has been required to be reduced especially in mobile devices such as smart phones and tablet computers. In order to reduce the power consumption of the display device, a low-frequency driving technology for driving or refreshing a display panel at a low frequency that is lower than a normal driving frequency has been developed.

Meanwhile, according to a conventional display device to which the low-frequency driving technology is applied, an entire region of the display panel is driven at a normal driving frequency when a still image is not displayed on the entire region of the display panel, that is, when a still image is displayed only on a partial region of the display panel. Therefore, in this case, low-frequency driving could not be performed, and power consumption could not be reduced.

A multi-frequency driving (MFD) technology for driving partial regions of a display panel at mutually different driving frequencies to reduce power consumption even when a still image is displayed on only a partial region of the display panel has been developed. According to a display device to which the multi-frequency driving technology is applied, a first display region in which a moving image is displayed may be driven at a normal driving frequency, and a second display region in which a still image is displayed may be driven at a low frequency that is lower than the normal driving frequency. Accordingly, even when the still image is displayed only in the second display region, the power consumption may be reduced.

However, according to the conventional display device to which the multi-frequency driving technology is applied, hardware configured to measure deterioration of the first display region and hardware configured to measure deterioration of the second display region results in a hardware size that is increased.

SUMMARY

In an embodiment, the invention provides a display panel driver capable of sampling a first display region and a second display region without distinction.

In an embodiment, the invention provides a method for driving a display device.

However, the invention is not limited thereto. Thus, embodiments of the invention may be extended without departing from the spirit and the scope of the invention.

According to embodiments, a display panel driver which drives a display panel may include a compensator configured to generate a data signal by compensating for input image data based on deterioration data, a sampler configured to generate, when a first display region of the display panel is scanned at a first driving frequency and when a second display region of the display panel is scanned at a second driving frequency that is less than the first driving frequency, a data signal corresponding to a sampling pixel by sampling the data signal at a sampling frequency that is less than or equal to the second driving frequency, and an accumulator configured to generate the deterioration data by accumulating the data signal corresponding to the sampling pixel.

In an embodiment, the sampling frequency may be 1/N times the second driving frequency, where N is a positive integer.

In an embodiment, the sampler may be configured to sample the data signal in a normal frame in which the first display region and the second display region are scanned.

In an embodiment, the sampler may be configured to not sample the data signal in a masking frame in which the second display region is not scanned.

In an embodiment, the display panel driver may further include a data processor configured to apply a scale factor to the data signal corresponding to the sampling pixel for the first display region. In addition, the accumulator may be configured to generate the deterioration data by accumulating the data signal corresponding to the sampling pixel to which the scale factor is applied.

In an embodiment, the scale factor may be a value obtained by dividing the first driving frequency by the second driving frequency.

In an embodiment, the display panel driver may further include a data processor configured to add a weight to the data signal corresponding to the sampling pixel for the first display region. In addition, the accumulator may be configured to generate the deterioration data by accumulating the data signal corresponding to the sampling pixel to which the weight is added.

In an embodiment, the weight may be gradually increased as a difference between the first driving frequency and the second driving frequency increases.

In an embodiment, the sampler may be configured to sequentially determine pixels of a panel block of the display panel as the sampling pixel.

In an embodiment, the sampler may be configured to sequentially determine panel block lines of the display panel as a sampling panel block line and to determine at least one of pixels of each of panel blocks of the sampling panel block line as the sampling pixel.

According to embodiments, a display device may include a display panel including a first display region that is scanned at a first driving frequency and a second display region that is scanned at a second driving frequency, wherein the second driving frequency is less than the first driving frequency, and a display panel driver configured to generate a data signal by compensating for input image data based on deterioration data, to generate a data signal corresponding to a sampling pixel by sampling the data signal at a sampling frequency that is less than or equal to the second driving frequency, to generate the deterioration data by accumulating the data signal corresponding to the sampling pixel, to generate a data voltage based on the data signal, and to provide the data voltage to the display panel.

In an embodiment, the display device may further include a non-volatile memory device configured to store the deterioration data, and provide the stored deterioration data to the display panel driver.

In an embodiment, the display panel driver may be configured to sample the data signal in a normal frame in which the first display region and the second display region are scanned.

In an embodiment, the display panel driver may be configured to not sample the data signal in a masking frame in which the second display region is not scanned.

In an embodiment, the display panel driver may be configured to apply a scale factor to the data signal corresponding to the sampling pixel for the first display region and to generate the deterioration data by accumulating the data signal corresponding to the sampling pixel to which the scale factor is applied.

In an embodiment, the display panel driver may be configured to add a weight to the data signal corresponding to the sampling pixel for the first display region and to generate the deterioration data by accumulating the data signal corresponding to the sampling pixel to which the weight is added.

In an embodiment, the display panel may further include a third display region that is driven at a third driving frequency, wherein the third driving frequency is less than the second driving frequency. In addition, the sampling frequency may be less than or equal to the third driving frequency.

In an embodiment, the sampling frequency may be 1/N times the third driving frequency, where N is a positive integer.

In an embodiment, the display panel driver may be configured to sample the data signal in a normal frame in which the first display region, the second display region, and the third display region are scanned.

In an embodiment, the display panel driver may be configured to not sample the data signal in a first masking frame in which the second display region and the third display region are not scanned and in a second masking frame in which the second display region is scanned and the third display region is not scanned.

A display panel driver according to embodiments may include a compensator configured to generate a data signal by compensating for input image data based on deterioration data, a sampler configured to generate, when a first display region of the display panel is scanned at a first driving frequency and when a second display region of the display panel is scanned at a second driving frequency that is less than the first driving frequency, a data signal corresponding to a sampling pixel by sampling the data signal at a sampling frequency that is less than or equal to the second driving frequency and an accumulator configured to generate the deterioration data by accumulating the data signal corresponding to the sampling pixel, so that the sampling can be performed to avoid a masking frame. Accordingly, the display panel driver can sample the first display region and the second display region without distinction. Since a configuration for separately sampling the first display region and the second display region is not required, a hardware size can be reduced.

In addition, the display panel driver may accumulate the data signal corresponding to the sampling pixel, so that an amount of computation and processing can be reduced as compared with a case where data signals for all pixels are accumulated. Accordingly, the hardware size can be reduced.

However, the effects of the invention are not limited thereto. Thus, the effects of the invention may be extended without departing from the spirit and the scope of the present disclosure.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
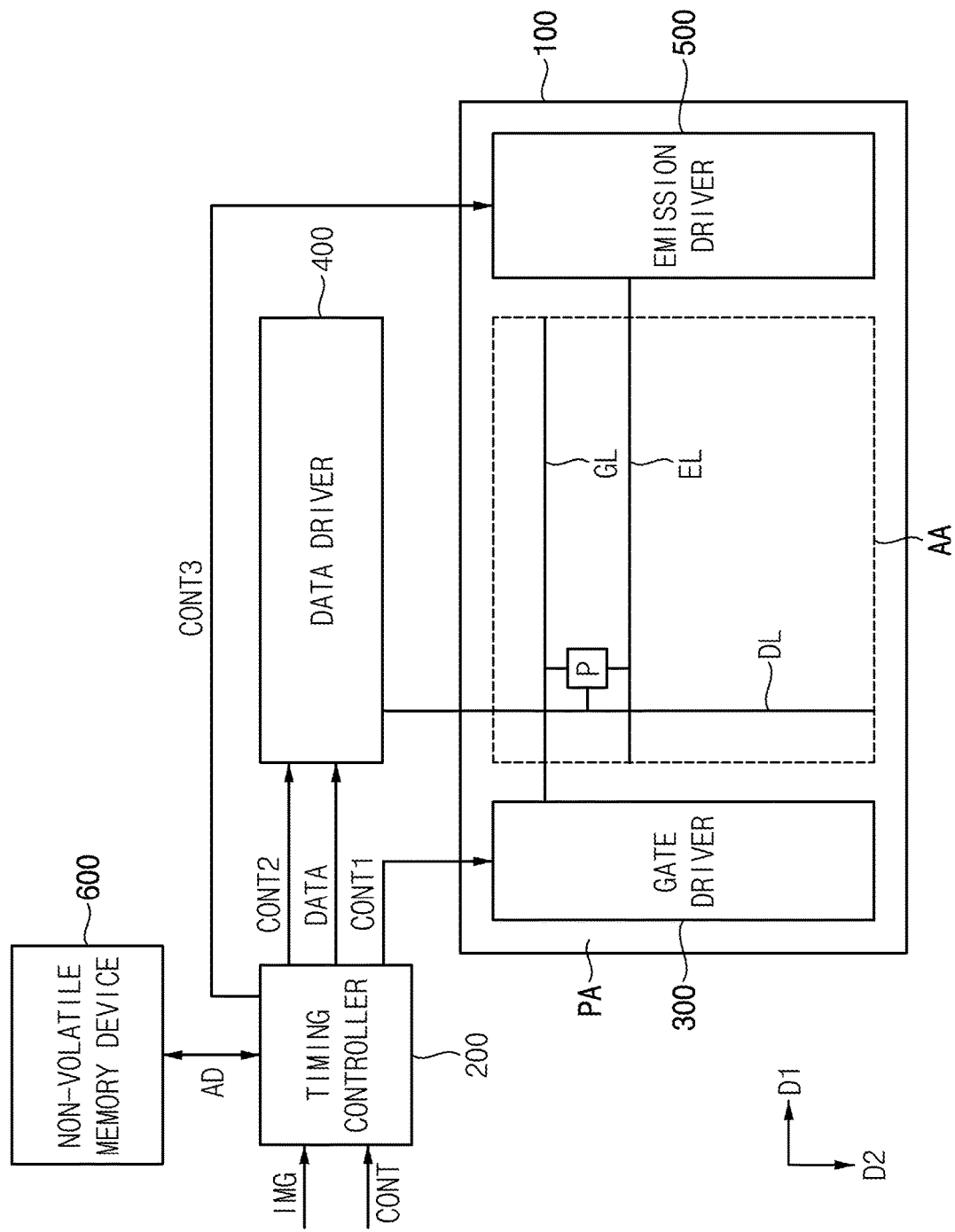
FIG. 1 is a schematic block diagram showing a display device, according to an embodiment.

The invention now will be described more fully hereinafter with reference to the accompanying drawings, in which various embodiments are shown. This invention may however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or a region, a layer, a portion, or the like) is referred to as being related to another such as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents. As used herein, the term "and/or" includes any and all combinations of one or more of the associated listed items.

The term "and/or," includes all combinations of one or more of which associated configurations may define.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the inventive concept. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "comprise", "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof. As used herein, being "disposed directly on" may mean that there is no additional layer, film, region, plate, or the like between a part and another part such as a layer, a film, a region, a plate, or the like. For example, being "disposed directly on" may mean that two layers or two members are disposed without using an additional member such as an adhesive member, therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram showing a display device, according to an embodiment.

In an embodiment and referring to FIG. 1, a display device may include a display panel driver and a display panel 100. The display panel driver may include a timing controller 200, a gate driver 300, a data driver 400, and an emission driver 500. According to an embodiment, the display device may further include a non-volatile memory device 600. The non-volatile memory device 600 will be described in detail below. According to an embodiment, the timing controller 200 and the data driver 400 may be integrated on a single chip.

In an embodiment, the display panel 100 may include a display region AA configured to display an image, and a peripheral region PA that is adjacent to the display region AA. According to an embodiment, the gate driver 300 and the emission driver 500 may be mounted on the peripheral region PA.

In an embodiment, the display panel 100 may include a plurality of gate lines GL, a plurality of data lines DL, a plurality of emission lines EL, and a plurality of pixels P electrically connected to the gate lines GL, the data lines DL, and the emission lines EL. The gate lines GL and the emission lines EL may extend in a first direction D1, and the data lines DL may extend in a second direction D2 intersecting the first direction D1.

In an embodiment, the timing controller 200 may receive input image data IMG and an input control signal CONT from a main processor (e.g., a graphic processing unit (GPU), etc.). For example, the input image data IMG may include red image data, green image data, and blue image data. According to an embodiment, the input image data IMG may further include white image data. As another example, the input image data IMG may include magenta image data, yellow image data, and/or cyan image data. The input control signal CONT may include a master clock signal and a data enable signal. The input control signal CONT may further include a vertical synchronization signal and/or a horizontal synchronization signal.

In an embodiment, the timing controller 200 may generate a first control signal CONT1, a second control signal CONT2, a third control signal CONT3, and a data signal DATA based on the input image data IMG and the input control signal CONT.

In an embodiment, the timing controller 200 may generate the first control signal CONT1 for controlling an operation of the gate driver 300 based on the input control signal CONT to output the generated first control signal CONT1 to the gate driver 300. The first control signal CONT1 may include a vertical start signal and a gate clock signal.

In an embodiment, the timing controller 200 may generate the second control signal CONT2 for controlling an operation of the data driver 400 based on the input control signal CONT to output the generated second control signal CONT2 to the data driver 400. The second control signal CONT2 may include a horizontal start signal and a load signal.

In an embodiment, the timing controller 200 may receive the input image data IMG and the input control signal CONT to generate the data signal DATA. The timing controller 200 may output the data signal DATA to the data driver 400.

In an embodiment, the timing controller 200 may generate the third control signal CONT3 for controlling an operation of the emission driver 500 based on the input control signal CONT to output the generated third control signal CONT3 to the emission driver 500. The third control signal CONT3 may include a vertical start signal and an emission clock signal.

In an embodiment, the gate driver 300 may generate gate signals for driving the gate lines GL in response to the first control signal CONT1 received from the timing controller 200. The gate driver 300 may output the gate signals to the gate lines GL. For example, the gate driver 300 may sequentially output the gate signals to the gate lines GL.

In an embodiment, the data driver 400 may receive the second control signal CONT2 and the data signal DATA from the timing controller 200. The data driver 400 may generate data voltages obtained by converting the data signal DATA into an analog voltage. The data driver 400 may output the data voltages to the data lines DL.

In an embodiment, the emission driver 500 may generate emission signals for driving the emission lines EL in response to the third control signal CONT3 received from the timing controller 200. The emission driver 500 may output the emission signals to the emission lines EL. For example, the emission driver 500 may sequentially output the emission signals to the emission lines EL.

Figure 2:
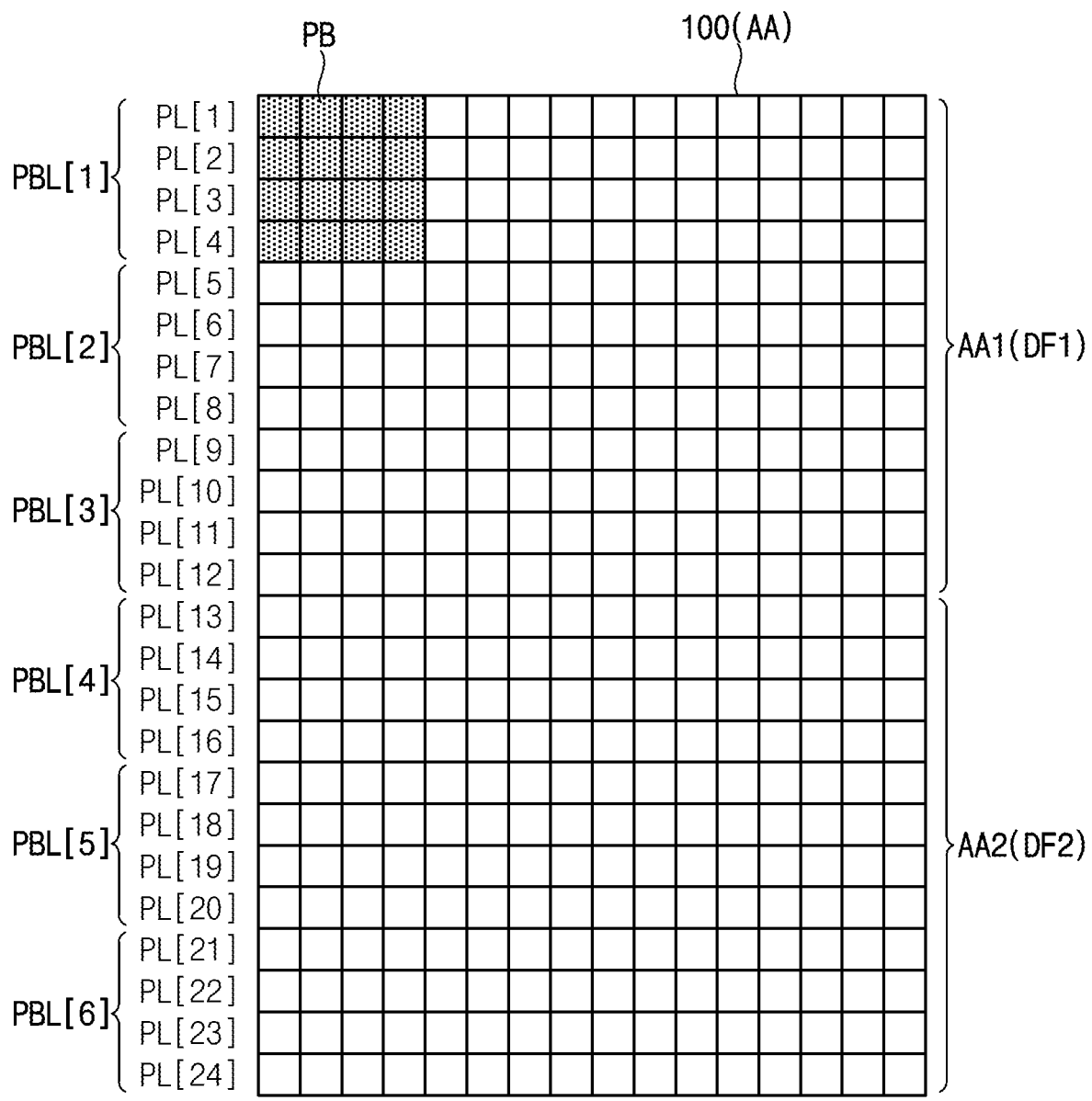
FIG. 2 is a plan view of a display panel of FIG. 1, according to an embodiment.
Figure 3:
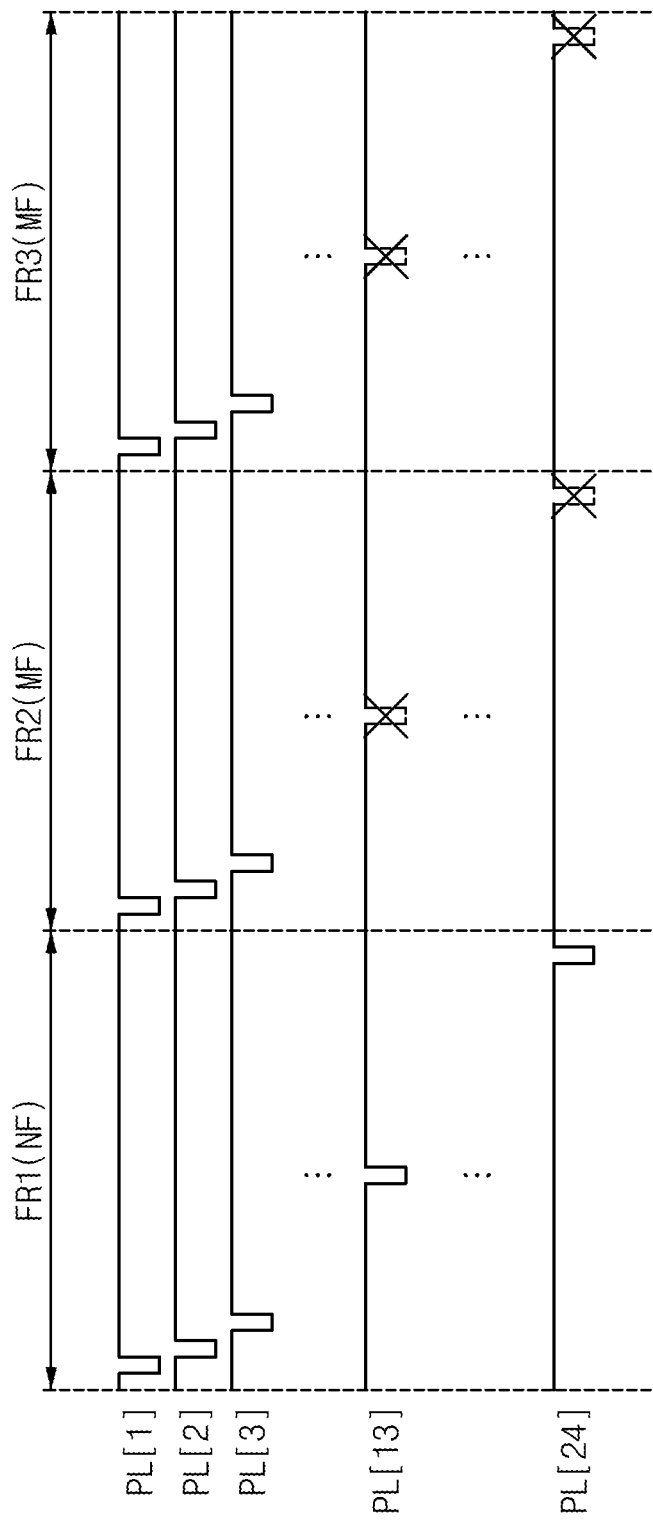
FIG. 3 is a timing diagram showing one example of scanning the display panel of FIG. 1, according to an embodiment.

FIG. 2 is a plan view showing one example of a display panel 100 of FIG. 1 according to an embodiment, and FIG. 3 is a timing diagram showing one example of scanning the display panel 100 of FIG. 1, according to an embodiment.

In an embodiment, one rectangular box in FIG. 2 may represent one pixel P.

In an embodiment and referring to FIGS. 1 to 3, the display panel 100 may include a first display region AA1 driven at a first driving frequency DF1, and a second display region AA2 driven at a second driving frequency DF2, wherein the second driving frequency DF2 is less than the first driving frequency DF1.

For example, in an embodiment, the first display region AA1 may be a display region AA in which a moving image is displayed, and the second display region AA2 may be a display region AA in which a still image is displayed.

In an embodiment, the display panel 100 may include a plurality of pixel lines PL[1], PL[2], ..., and PL[24]. The pixels P of each of the pixel lines PL[1], PL[2], ..., and PL[24] may be simultaneously scanned. For example, the pixels P of each of the pixel lines PL[1], PL[2], ..., and PL[24] may be connected to the same gate line GL.

In an embodiment, the display panel driver may scan the first display region AA1 and the second display region AA2 in a normal frame NF. For example, the display panel driver may sequentially scan the pixel lines PL[1], PL[2], ..., and PL[24] of the first display region AA1 and the second display region AA2 in the normal frame NF.

Although 24 pixel lines PL[1], PL[2], ..., and PL[24] have been illustrated in an embodiment, the invention is not limited to the number of the pixels P and/or the pixel lines PL[1], PL[2], ..., and PL[24].

In an embodiment, the display panel driver may scan the first display region AA1 in a masking frame MF. For example, the display panel driver may sequentially scan the pixel lines PL[1], PL[2], ..., and PL[12] of the first display region in the masking frame MF.

For example, in an embodiment and as shown in FIG. 3, when the first driving frequency DF1 is 60 Hz, and the second driving frequency DF2 is 20 Hz, the first display region AA1 and the second display region AA2 may be scanned in a first frame FR1, and the first display region AA1 may be scanned in a second frame FR2 and a third frame FR3.

In an embodiment, the display panel 100 may include panel blocks PB including the pixels P. For example, each of the panel blocks PB may include 4×4 pixels P. Deterioration data AD may be data on one panel block PB. The above configuration will be described in detail below.

Although each of the panel blocks PB has been illustrated in the present embodiment as including 4×4 pixels P, the invention is not limited to the number of the pixels P included in each of the panel blocks PB.

In an embodiment, the display panel 100 may include panel block lines PBL[1], PBL[2], ..., and PBL[6] including the panel blocks PB. For example, the panel block lines PBL[1], PBL[2], ..., and PBL[6] may extend in a direction parallel to the pixel lines PL[1], PL[2], ..., and PL[24]. For example, sampling that will be described below may be performed in units of the panel block lines PBL[1], PBL[2], ..., and PBL[6]. The above configuration will be described in detail below.

Figure 4:
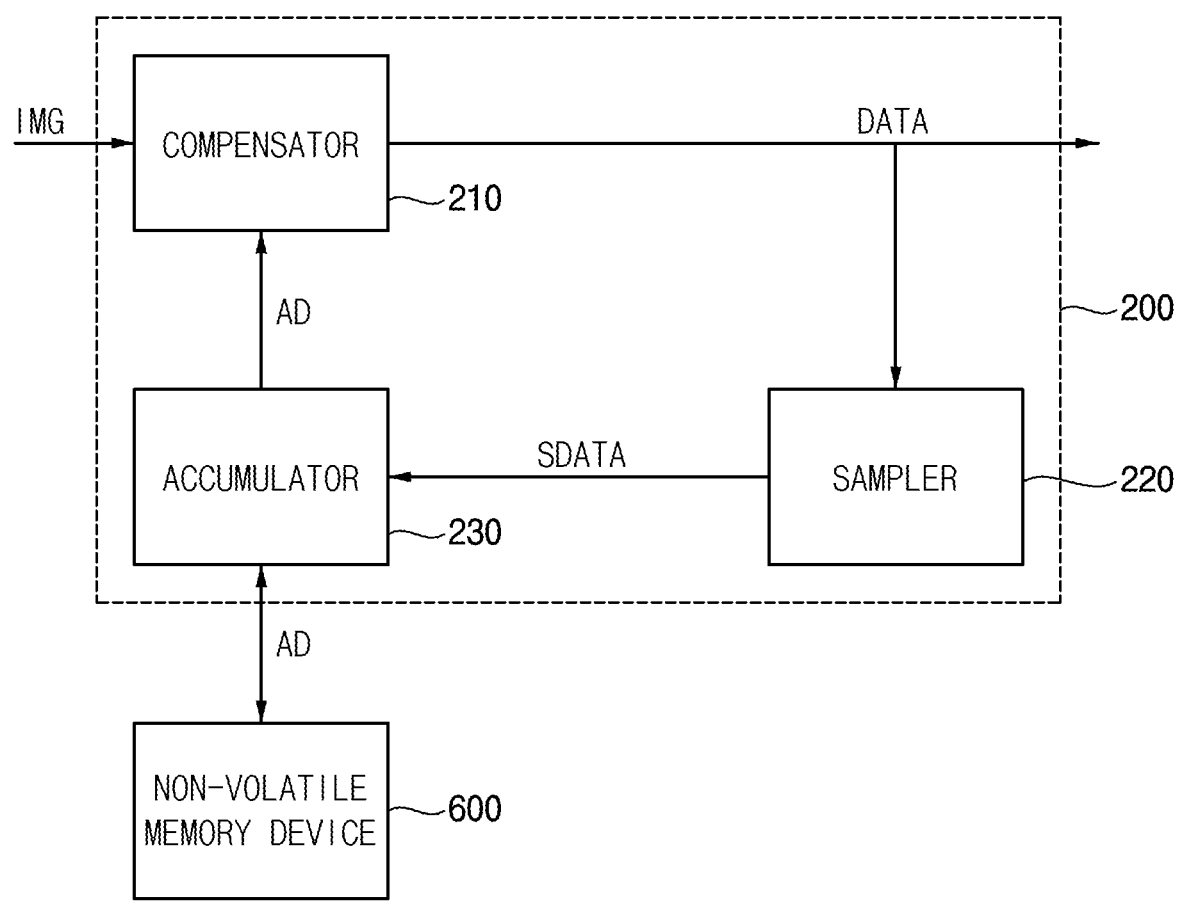
FIG. 4 is a schematic block diagram showing one example of a timing controller and a non-volatile memory device of the display device of FIG. 1, according to an embodiment.

FIG. 4 is a schematic block diagram showing one example of a timing controller 200 and a non-volatile memory device 600 of the display device of FIG. 1, according to an invention.

In an embodiment and referring to FIGS. 2 to 4, the timing controller 200 may include a compensator 210 configured to generate a data signal DATA by compensating for input image data IMG based on deterioration data AD, a sampler 220 configured to generate a data signal SDATA corresponding to a sampling pixel by sampling the data signal DATA at a sampling frequency that is less than or equal to the second driving frequency DF2 and an accumulator 230 configured to generate the deterioration data AD by accumulating the data signal SDATA corresponding to the sampling pixel.

In an embodiment, the sampler 220 may generate the data signal SDATA corresponding to the sampling pixel by sampling the data signal DATA at the sampling frequency. For example, the data signal SDATA corresponding to the sampling pixel may be a data signal DATA for a data voltage applied to the sampling pixel.

In an embodiment, when the display panel driver generates the deterioration data AD by accumulating data signals DATA corresponding to all the pixels P, an amount of computation and processing may be large. Accordingly, a hardware size may be increased. Therefore, the display panel driver may accumulate the data signal SDATA corresponding to the sampling pixel, so that the amount of computation and processing may be reduced as compared with a case where the data signals DATA for all the pixels P are accumulated. Accordingly, the hardware size may be reduced.

In addition, in an embodiment, when the first display region AA1 and the second display region AA2 are separately sampled due to the masking frame MF, a configuration for separately sampling the first display region AA1 and the second display region AA2 may be required. In this case, the hardware size may be increased. Therefore, the display panel driver may perform the sampling at the sampling frequency that is less than or equal to the second driving frequency DF2 to sample the first display region AA1 and the second display region AA2 without distinction. Accordingly, since the configuration for separately sampling the first display region and the second display region is not required, the hardware size may be reduced.

In an embodiment, the accumulator 230 may generate the deterioration data AD by accumulating the data signal SDATA corresponding to the sampling pixel.

In an embodiment, the deterioration data AD may be data on one panel block PB. The accumulator 230 may determine the sampling pixel as a pixel P representing each of the panel blocks PB, and determine a deterioration degree of each of the panel blocks PB by accumulating the data signal SDATA corresponding to the sampling pixel to the deterioration data AD of each of the panel blocks PB.

According to an embodiment, the accumulator 230 may include a volatile memory. The non-volatile memory device 600 may store the deterioration data AD, and provide the stored deterioration data AD to the accumulator 230. Accordingly, when a power of the display device is turned off and turned on again, the accumulator 230 may continuously accumulate the data signal SDATA corresponding to the sampling pixel to the deterioration data AD before the power is turned off.

In an embodiment, the compensator 210 may compensate for the input image data IMG based on the deterioration data AD. For example, the compensator 210 may equally compensate for the pixels P of the panel block PB based on the deterioration data AD of the panel block PB.

In an embodiment, as a driving time of the display device increases, the pixels P may deteriorate. Accordingly, the pixels P may not emit lights with a uniform luminance. Therefore, the compensator 210 may determine deterioration degrees of the pixels P from the deterioration data AD, and compensate for the input image data IMG according to the deterioration degrees.

According to an embodiment, the display panel driver may compress and accumulate the data signal SDATA corresponding to the sampling pixel. According to an embodiment, the display panel driver may reflect and accumulate a temperature of the display panel 100 to the data signal SDATA corresponding to the sampling pixel.

According to various embodiments, the compensator 210, the sampler 220, the accumulator 230, and a data processor 240 that will be described below may be implemented in the form of hardware, software, firmware, and/or an application-specific integrated circuit (ASIC).

Figure 5:
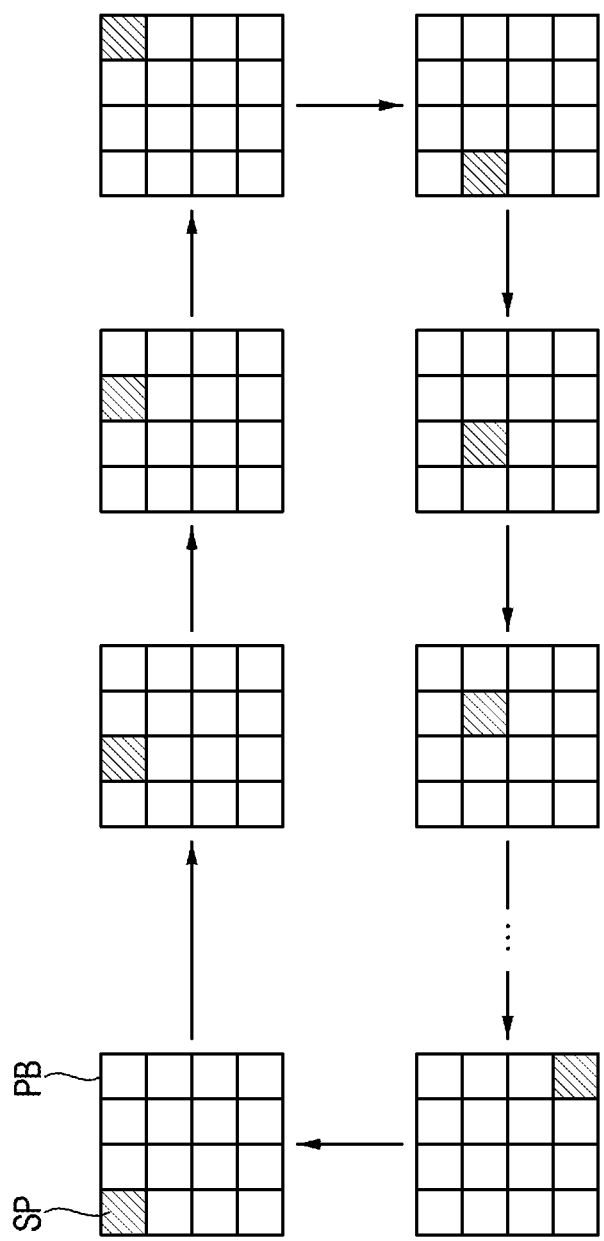
FIG. 5 shows one example of an order in which the display device of FIG. 1 determines a sampling pixel in one panel block, according to an embodiment.

In an embodiment, FIG. 5 shows one example of an order in which the display device of FIG. 1 determines a sampling pixel SP in one panel block PB.

In an embodiment and referring to FIGS. 2, 4, and 5, the sampler 220 may sequentially determine the pixels P of the panel block PB as a sampling pixel SP. In other words, the pixels P of the panel block PB may be uniformly determined as the sampling pixels SP.

For example, in an embodiment, as shown in FIG. 5, when one panel block PB includes 16 pixels P, the 16 pixels P may be sequentially determined as the sampling pixel SP.

However, the invention is not limited to an order in which the pixels P of the panel block PB are determined as the sampling pixels SP and the number of the sampling pixels SP.

Figure 6:
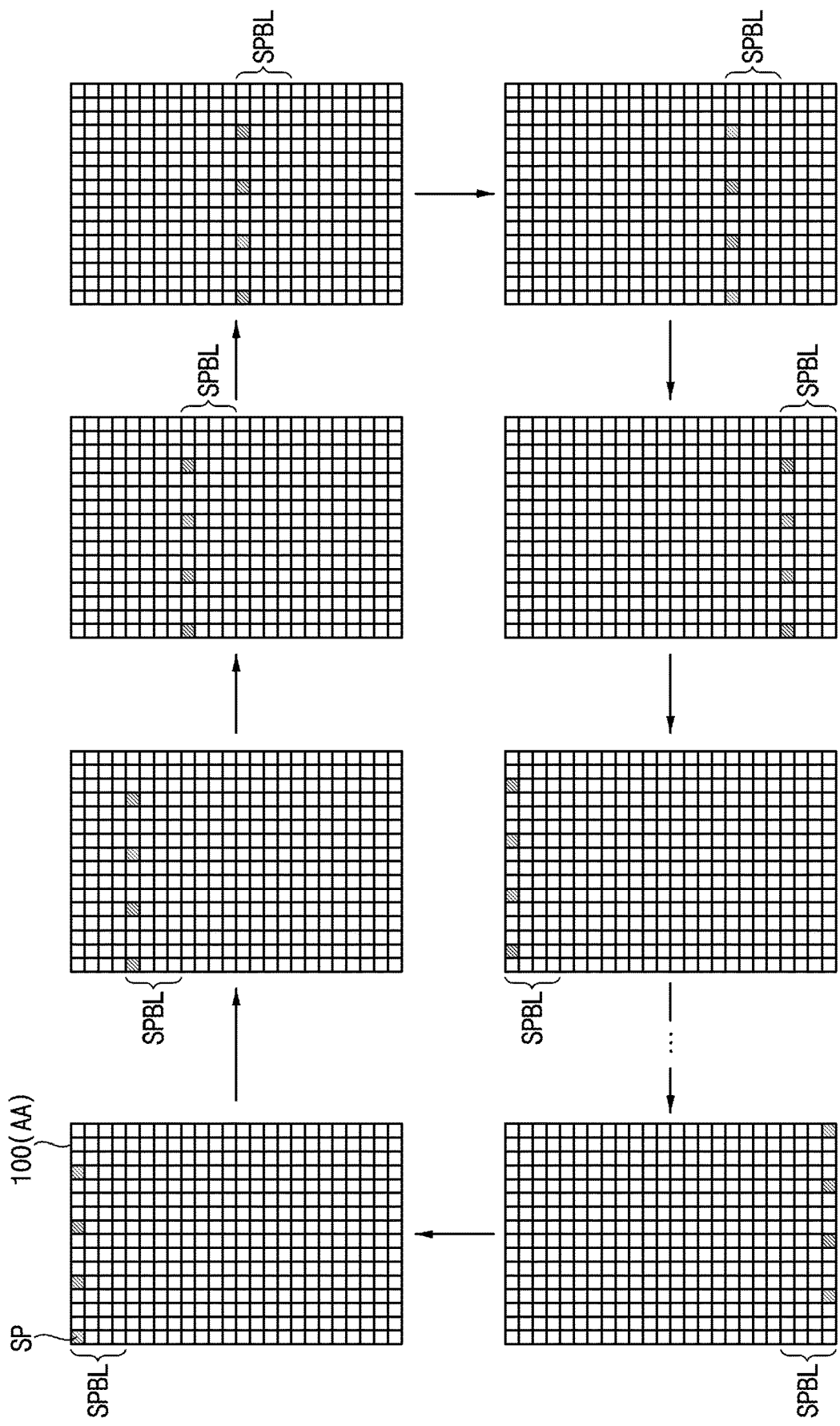
FIG. 6 illustrates one example of an order in which the display device of FIG. 1 determines a sampling panel block line, according to an embodiment.
Figure 7:
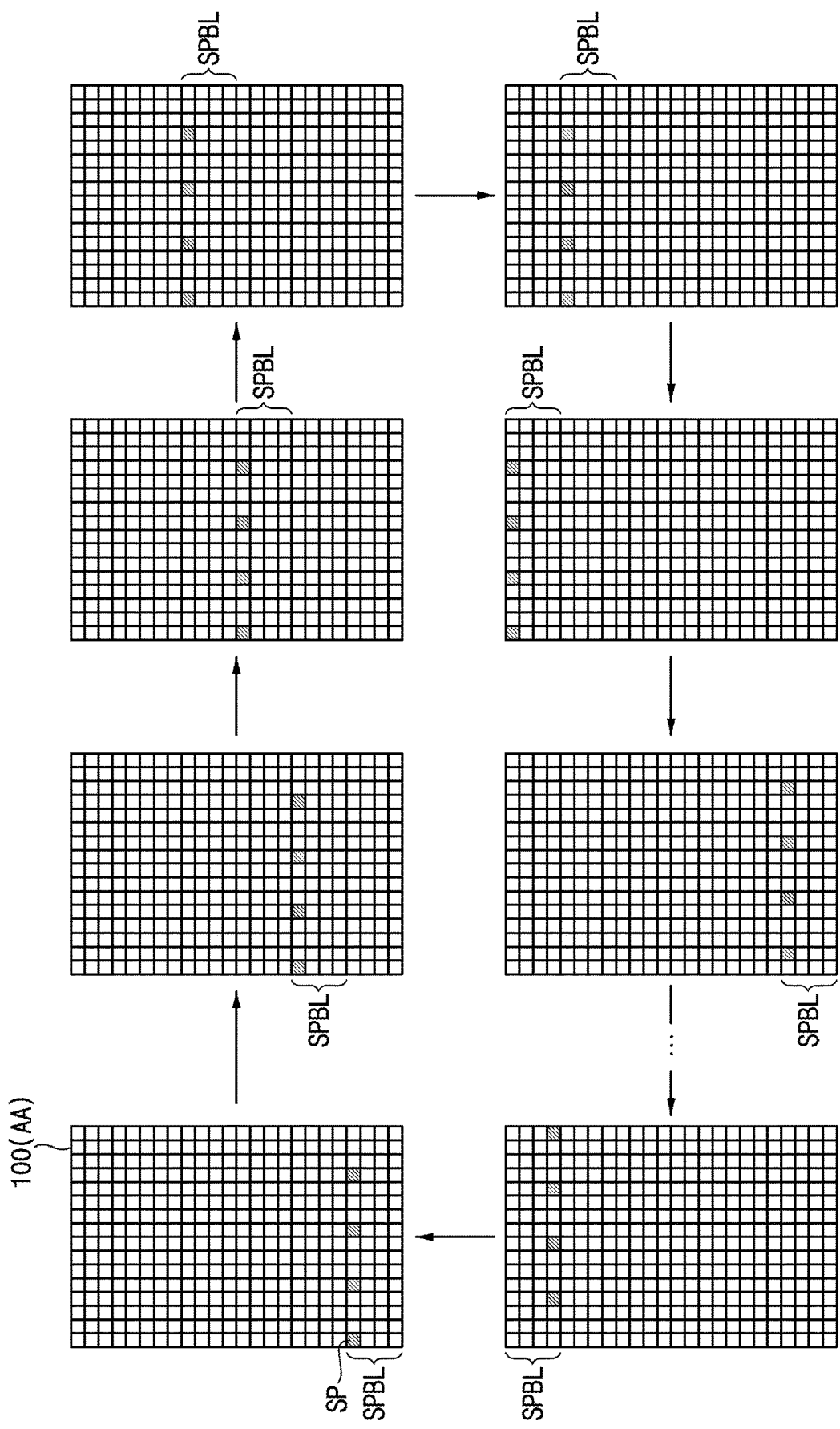
FIG. 7 illustrates one example of an order in which the display device of FIG. 1 determines a sampling panel block line, according to an embodiment.

In an embodiment, FIGS. 6 and 7 are views showing one example of an order in which the display device of FIG. 1 determines a sampling panel block line SPBL.

In an embodiment and referring to FIGS. 2 and 4 to 7, the sampler 220 may sequentially determine the panel block lines PBL[1], PBL[2], . . . , and PBL[6] of the display panel 100 as a sampling panel block line SPBL, and determine at least one of the pixels P of each of the panel blocks PB of the sampling panel block line SPBL as the sampling pixel SP.

For example, in an embodiment, the sampler 220 may determine one of the panel block lines PBL[1], PBL[2], . . . , and PBL[6] to be the sampling panel block line SPBL, and determine one of the pixels P of each of the panel blocks PB of the sampling panel block line SPBL to be the sampling pixel SP according to the order of FIG. 5.

For example, in an embodiment and as shown in FIG. 6, after a first panel block line PBL[1] is determined to be the sampling panel block line SPBL, a second panel block line PBL[2] may be determined to be the sampling panel block line SPBL. For example, after the second panel block line PBL[2] is determined to be the sampling panel block line SPBL, a third panel block line PBL[3] may be determined to be the sampling panel block line SPBL. For example, after the third panel block line PBL[3] is determined to be the sampling panel block line SPBL, a fourth panel block line PBL[4] may be determined to be the sampling panel block line SPBL. For example, after the fourth panel block line PBL[4] is determined to be the sampling panel block line SPBL, a fifth panel block line PBL[5] may be determined to be the sampling panel block line SPBL. For example, after the fifth panel block line PBL[5] is determined to be the sampling panel block line SPBL, a sixth panel block line PBL[6] may be determined to be the sampling panel block line SPBL.

For example, in an embodiment and as shown in FIG. 7, after the sixth panel block line PBL[6] is determined to be the sampling panel block line SPBL, the fifth panel block line PBL[5] may be determined to be the sampling panel block line SPBL. For example, after the fifth panel block line PBL[5] is determined to be the sampling panel block line SPBL, the fourth panel block line PBL[4] may be determined to be the sampling panel block line SPBL. For example, after the fourth panel block line PBL[4] is determined to be the sampling panel block line SPBL, the third panel block line PBL[3] may be determined to be the sampling panel block line SPBL. For example, after the third panel block line PBL[3] is determined to be the sampling panel block line SPBL, the second panel block line PBL[2] may be determined to be the sampling panel block line SPBL. For example, after the second panel block line PBL[2] is determined to be the sampling panel block line SPBL, the first panel block line PBL[1] may be determined to be the sampling panel block line SPBL.

However, the invention is not limited to an order in which the panel block lines PBL[1], PBL[2], . . . , and PBL[6] are determined to be the sampling panel block line SPBL and the number of sampling panel block lines SPBL.

Figure 8:
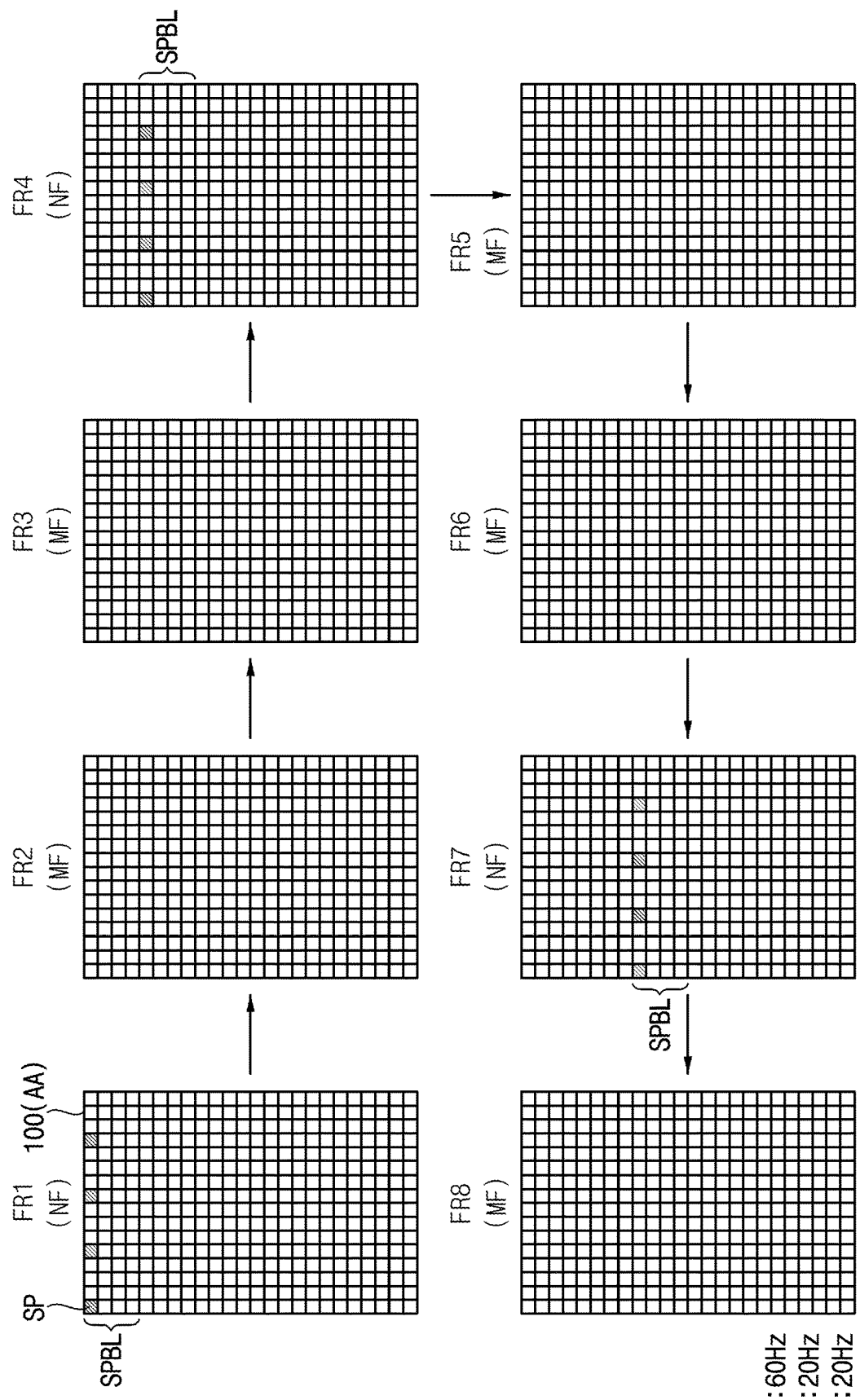
FIG. 8 shows one example of sampling performed by the display device of FIG. 1, according to an embodiment.

FIG. 8 is a view showing one example of sampling performed by the display device of FIG. 1, according to an embodiment.

In an embodiment, FIG. 8 shows that the first driving frequency DF1 is 60 Hz, the second driving frequency DF2 is 20 Hz, and a sampling frequency SAF is 20 Hz, and also shows that the sampling is performed according to the order of FIG. 6.

In an embodiment and referring to FIGS. 2, 3, 4, and 8, the sampler 220 may sample the data signal DATA in the normal frame NF in which the first display region AA1 and the second display region AA2 are scanned. The sampler 220 may not sample the data signal DATA in the masking frame MF in which the second display region AA2 is not scanned.

According to an embodiment, the sampling frequency SAF may be the second driving frequency DF2. Accordingly, the sampler 220 may perform the sampling to avoid the masking frame MF.

For example, in an embodiment, the display panel driver may scan the first display region AA1 every frame, and scan the second display region AA2 every three frames. For example, first, fourth, and seventh frames FR1, FR4, and FR7, respectively, may be normal frames NF. For example, second, third, fifth, sixth, and eighth frames FR2, FR3, FR5, FR6, and FR8, respectively, may be masking frames MF.

For example, in an embodiment, the sampler 220 may determine the first panel block line PBL[1] as the sampling panel block line SPBL in the first frame FR1. For example, the sampler 220 may determine the second panel block line PBL[2] as the sampling panel block line SPBL in the fourth frame FR4. For example, the sampler 220 may determine the third panel block line PBL[3] as the sampling panel block line SPBL in the seventh frame FR7.

Figure 9:
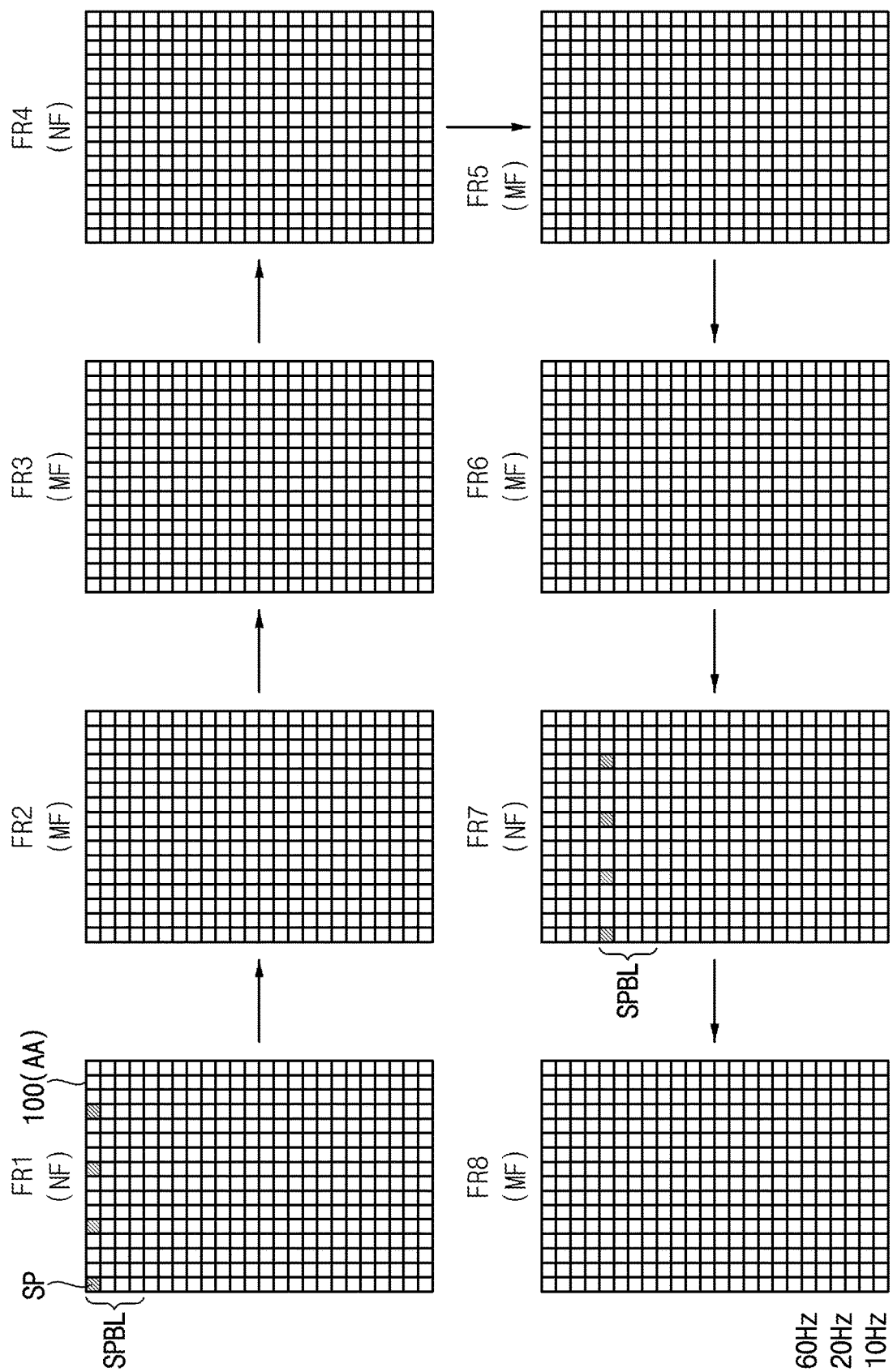
FIG. 9 shows one example of sampling performed by the display device of FIG. 1, according to an embodiment.

FIG. 9 is a view showing one example of sampling performed by the display device of FIG. 1, according to an embodiment.

In an embodiment, FIG. 9 shows that the first driving frequency DF1 is 60 Hz, the second driving frequency DF2 is 20 Hz, and the sampling frequency SAF is 10 Hz.

In an embodiment and referring to FIGS. 2 to 4 and 9, the sampler 220 may sample the data signal DATA in the normal frame NF in which the first display region AA1 and the second display region AA2 are scanned. The sampler 220 may not sample the data signal DATA in the masking frame MF in which the second display region AA2 is not scanned.

According to an embodiment, the sampling frequency SAF may be less than the second driving frequency DF2. The sampling frequency SAF may be 1/N times the second driving frequency DF2, where N is a positive integer. Accordingly, the sampler 220 may perform the sampling to avoid the masking frame MF.

For example, in an embodiment, the display panel driver may scan the first display region AA1 every frame, and scan the second display region AA2 every three frames. For example, first, fourth, and seventh frames FR1, FR4, and FR7, respectively, may be normal frames NF. For example, second, third, fifth, sixth, and eighth frames FR2, FR3, FR5, FR6, and FR8, respectively, may be masking frames MF.

For example, in an embodiment, when N is 2, the sampler 220 may determine the first panel block line PBL[1] as the sampling panel block line SPBL in the first frame FR1, and determine the second panel block line PBL[2] as the sampling panel block line SPBL in the seventh frame FR7.

Figure 10:
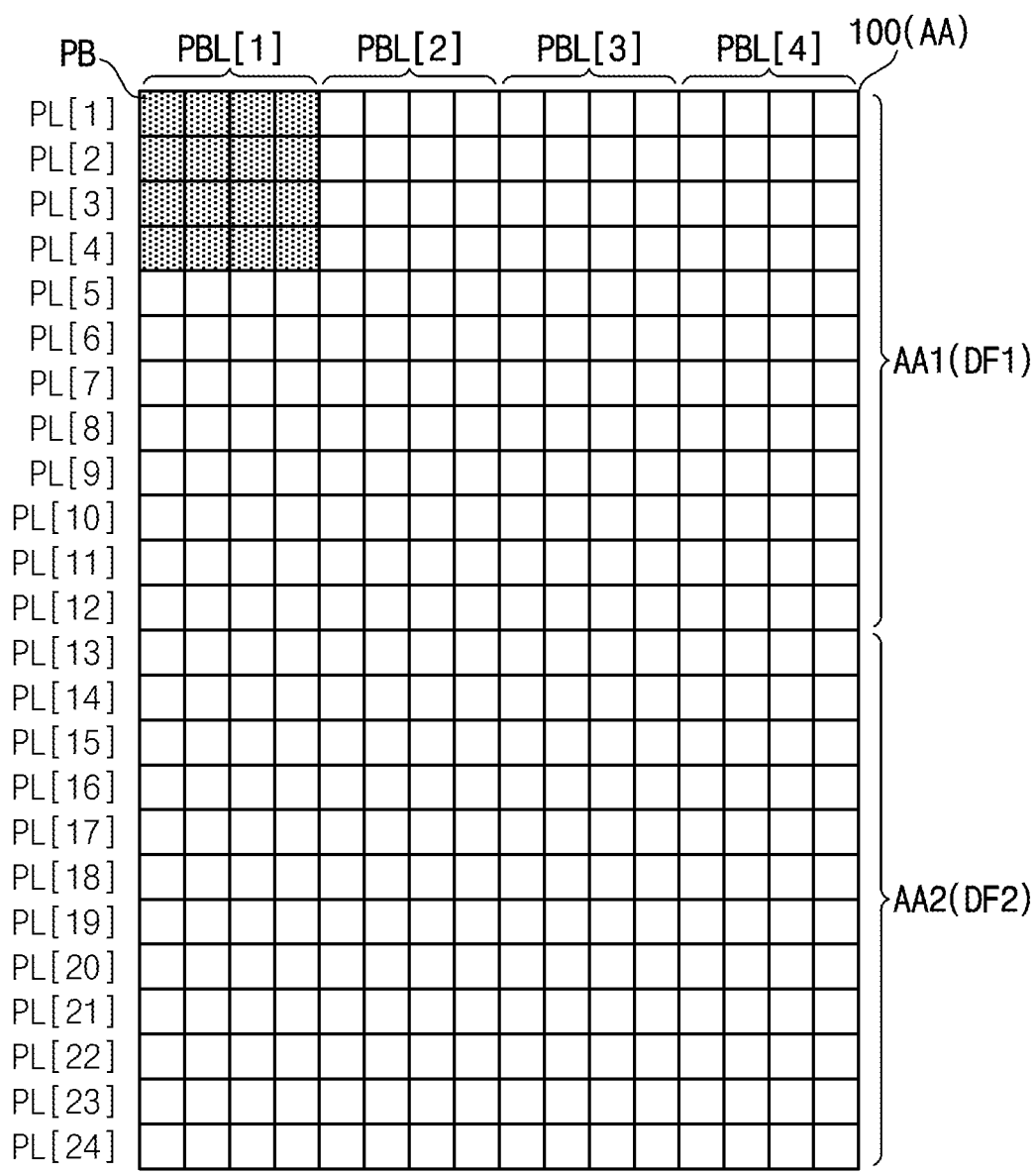
FIG. 10 is a plan view showing one example of a display panel of a display device, according to an embodiment.
Figure 11:
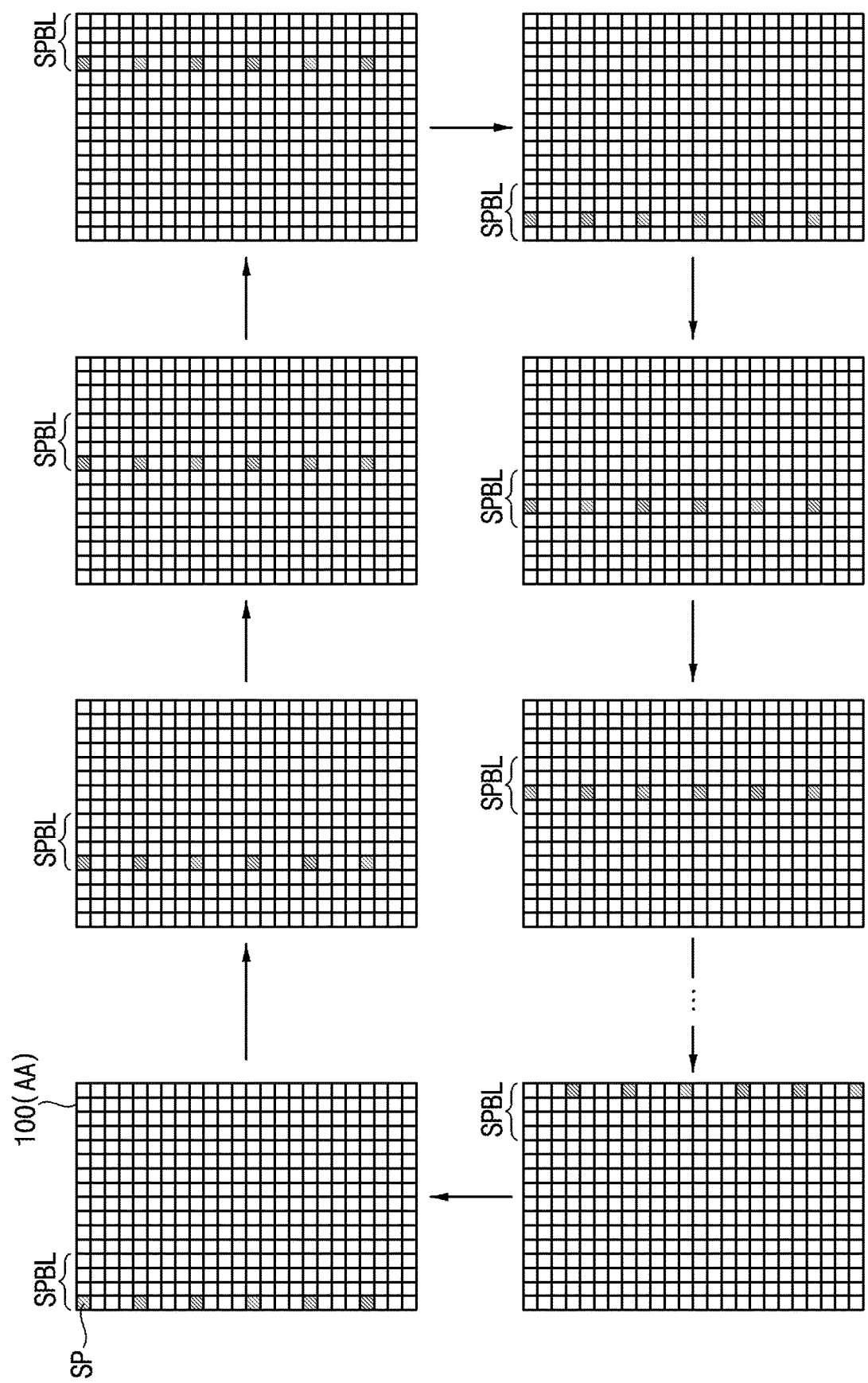
FIG. 11 shows one example of an order in which the display device of FIG. 10 determines a sampling panel block line, according to an embodiment.

FIG. 10 is a view showing one example of a display panel 100 of a display device according to an embodiment, and FIG. 11 is a view showing one example of an order in which the display device of FIG. 10 determines a sampling panel block line SPBL, according to an embodiment.

Since a display device according to embodiments has a configuration that is substantially identical to the configuration of the display device of FIG. 1 except for panel block lines PBL[1], PBL[2], PBL[3], and PBL[4], the same reference numerals and reference signs will be used for the same or similar components, and redundant descriptions will be omitted.

In an embodiment and referring to FIGS. 3, 4, 10, and 11, the display panel 100 may include panel block lines PBL[1], PBL[2], PBL[3], and PBL[4] including the panel blocks PB. For example, the panel block lines PBL[1], PBL[2], PBL[3], and PBL[4] may extend in a direction intersecting the pixel lines PL[1], PL[2], . . . , and PL[24].

In an embodiment, the sampler 220 may sequentially determine the panel block lines PBL[1], PBL[2], PBL[3], and PBL[4] of the display panel 100 as the sampling panel block line SPBL, and determine at least one of the pixels P of each of the panel blocks PB of the sampling panel block line SPBL to be the sampling pixel SP.

For example, in an embodiment, the sampler 220 may determine one of the panel block lines PBL[1], PBL[2], PBL[3], and PBL[4] to be the sampling panel block line SPBL, and determine one of the pixels P of each of the panel blocks PB of the sampling panel block line SPBL to be the sampling pixel SP according to the order of FIG. 5.

For example, in an embodiment and as shown in FIG. 11, after a first panel block line PBL[1] is determined to be the sampling panel block line SPBL, a second panel block line PBL[2] may be determined to be the sampling panel block line SPBL. For example, after the second panel block line PBL[2] is determined to be the sampling panel block line SPBL, a third panel block line PBL[3] may be determined to be the sampling panel block line SPBL. For example, after the third panel block line PBL[3] is determined to be the sampling panel block line SPBL, a fourth panel block line PBL[4] may be determined to be the sampling panel block line SPBL.

However, the invention is not limited to an order in which the panel block lines PBL[1], PBL[2], PBL[3], and PBL[4] are determined to be the sampling panel block line SPBL and the number of sampling panel block lines SPBL.

Figure 12:
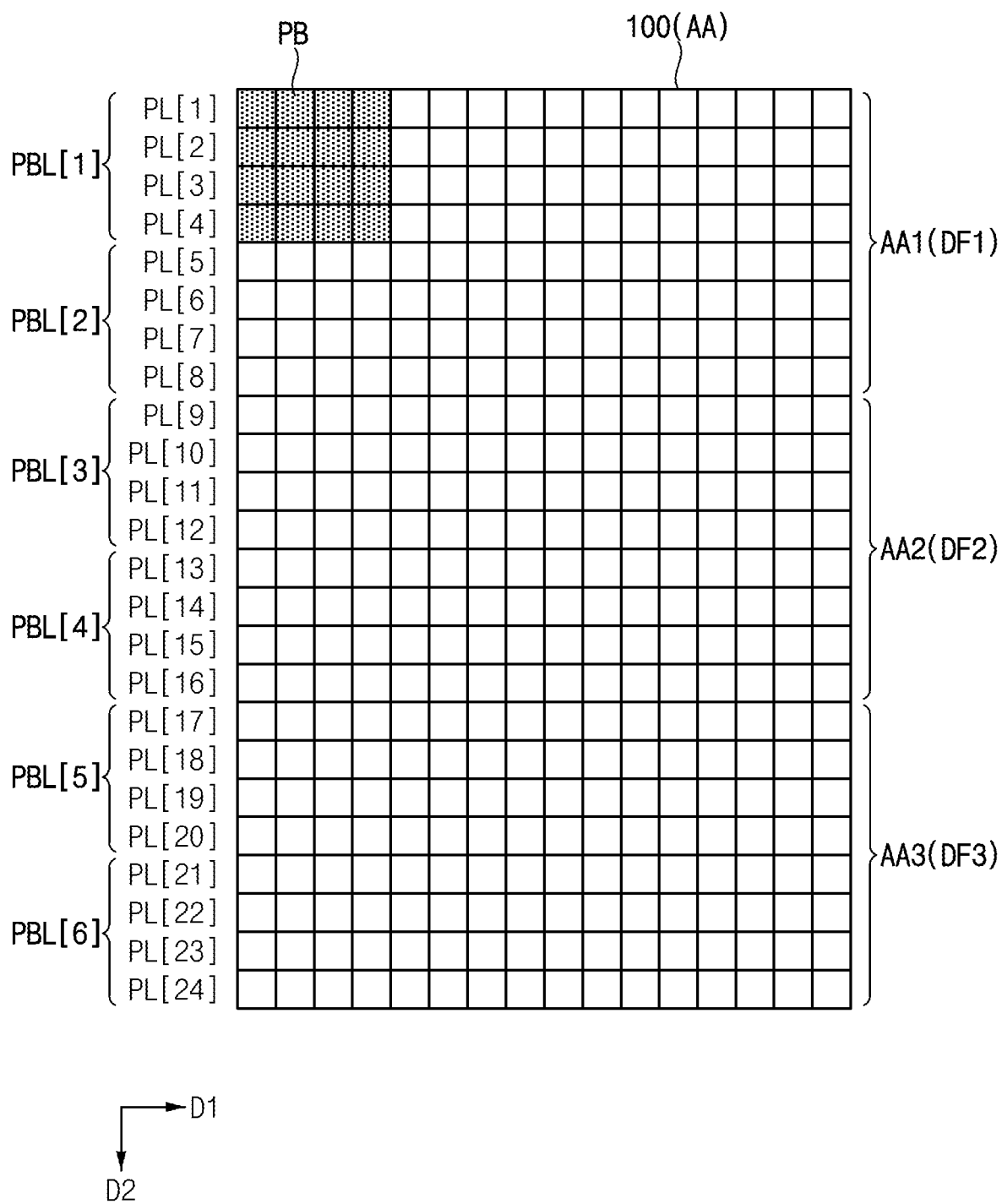
FIG. 12 is a plan view showing one example of a display panel of a display device, according to an embodiment.
Figure 13:
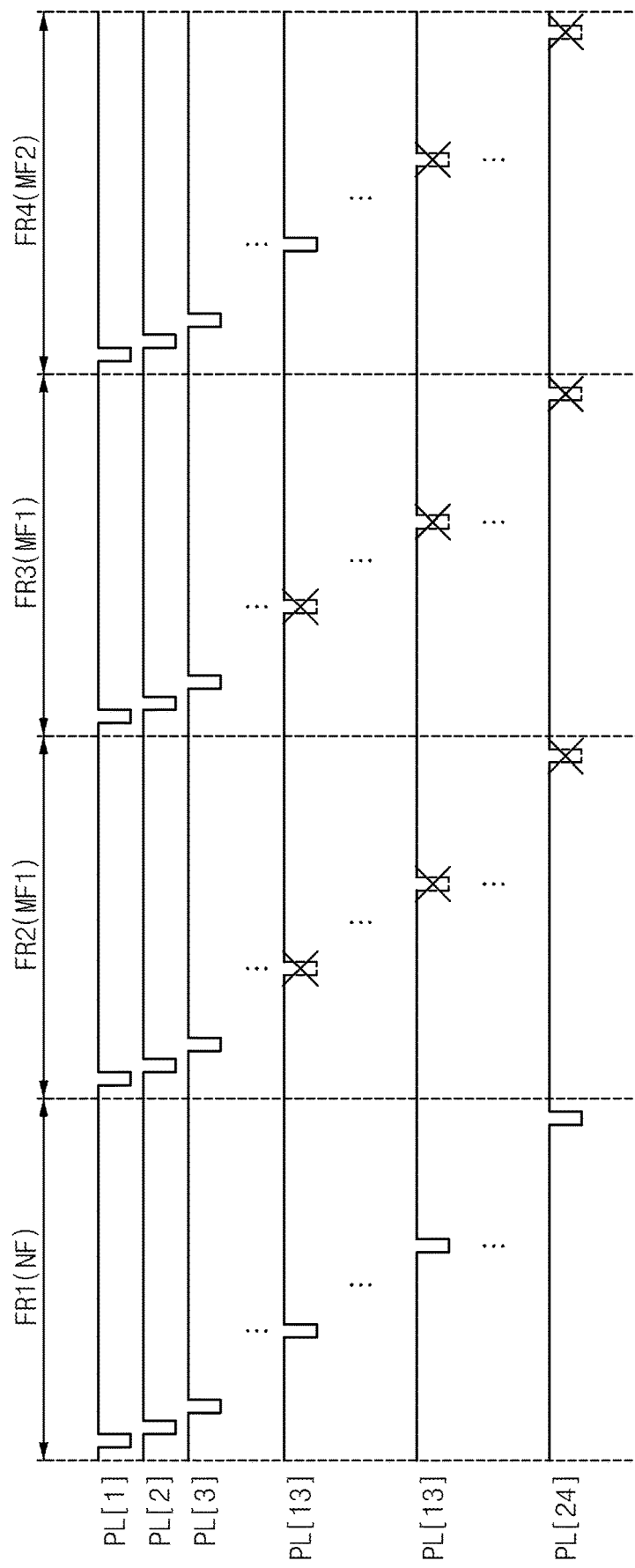
FIG. 13 is a timing diagram showing one example of scanning the display panel of FIG. 12, according to an embodiment.
Figure 14:
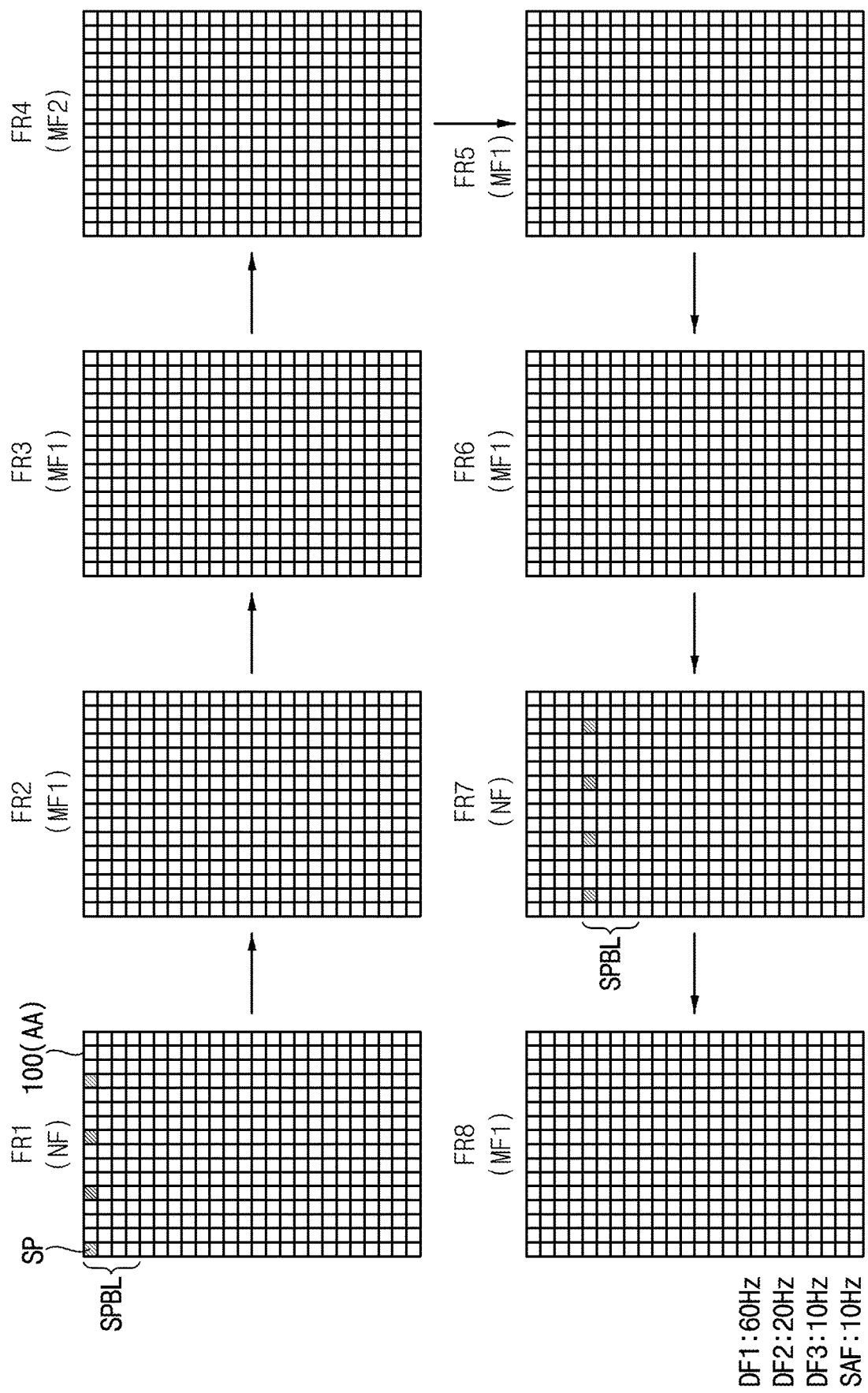
FIG. 14 shows one example of sampling performed by the display device of FIG. 12, according to an embodiment.

FIG. 12 is a view showing one example of a display panel 100 of a display device according to embodiments, FIG. 13 is a timing diagram showing one example of scanning the display panel 100 of FIG. 12 according to an embodiment, and FIG. 14 is a view showing one example of sampling performed by the display device of FIG. 12, according to an embodiment.

In an embodiment, FIG. 14 shows that the first driving frequency DF1 is 60 Hz, the second driving frequency DF2 is 20 Hz, a third driving frequency DF3 is 10 Hz, and the sampling frequency SAF is 10 Hz.

Since a display device according to embodiments has a configuration that is substantially identical to the configuration of the display device of FIG. 1 except for a third display region AA3, the same reference numerals and reference signs will be used for the same or similar components, and redundant descriptions will be omitted.

In an embodiment and referring to FIGS. 1, 12, and 13, the display panel 100 may include a first display region AA1 driven at a first driving frequency DF1, a second display region AA2 driven at a second driving frequency DF2 that is less than the first driving frequency DF1 and a third display region AA3 driven at a third driving frequency DF3 that is less than the second driving frequency DF2.

In an embodiment, the display panel driver may scan the first display region AA1, the second display region AA2, and the third display region AA3 in the normal frame NF. For example, the display panel driver may sequentially scan the pixel lines PL[1], PL[2], . . . , and PL[24] of the first display region AA1, the second display region AA2, and the third display region AA3 in the normal frame NF.

In an embodiment, the display panel driver may scan the first display region AA1 in a first masking frame MF1. For example, the display panel driver may sequentially scan the pixel lines PL[1], PL[2], . . . , and PL[8] of the first display region AA1 and may be in the first masking frame MF1.

In an embodiment, the display panel driver may scan the first display region AA1 and the second display region AA2 in a second masking frame MF2. For example, the display panel driver may sequentially scan the pixel lines PL[1], PL[2], . . . , and PL[16] of the first display region AA1 and the second display region AA2 in the second masking frame MF2.

For example, in an embodiment and as shown in FIG. 13, when the first driving frequency DF1 is 60 Hz, the second driving frequency DF2 is 20 Hz, and the third driving frequency DF3 is 10 Hz, the first display region AA1, the second display region AA2, and the third display region AA3 may be scanned in a first frame FR1, the first display region AA1 may be scanned in a second frame FR2 and a third frame FR3, and the first display region AA1 and the second display region AA2 may be scanned in a fourth frame FR4.

In an embodiment and referring to FIGS. 4, 12, 13 and 14, the sampler 220 may sample the data signal DATA in the normal frame NF in which the first display region AA1, the second display region AA2, and the third display region AA3 are scanned. The sampler 220 may not sample the data signal DATA in the first masking frame MF1 in which the second display region AA2 and the third display region AA3 are not scanned and the second masking frame MF2 in which the third display region AA3 is not scanned.

In an embodiment, the sampling frequency SAF may be less than or equal to the third driving frequency DF3. The sampling frequency SAF may be 1/N times the third driving frequency DF3. Accordingly, the sampler 220 may perform the sampling to avoid the first masking frame MF1 and the second masking frame MF2.

For example, in an embodiment, the display panel driver may scan the first display region AA1 every frame, scan the second display region AA2 every three frames, and scan the third display region AA3 every six frames.

For example, in an embodiment, first and seventh frames FR1 and FR7, respectively, may be normal frames NF. For example, second, third, fifth, sixth, and eighth frames FR2, FR3, FR5, FR6, and FR8 may be first masking frames MF1. For example, a fourth frame FR4 may be a second masking frame MF2.

For example, in an embodiment, when N is 1, the sampler 220 may determine the first panel block line PBL[1] to be the sampling panel block line SPBL in the first frame FR1, and determine the second panel block line PBL[2] to be the sampling panel block line SPBL in the seventh frame FR7.

Figure 15:
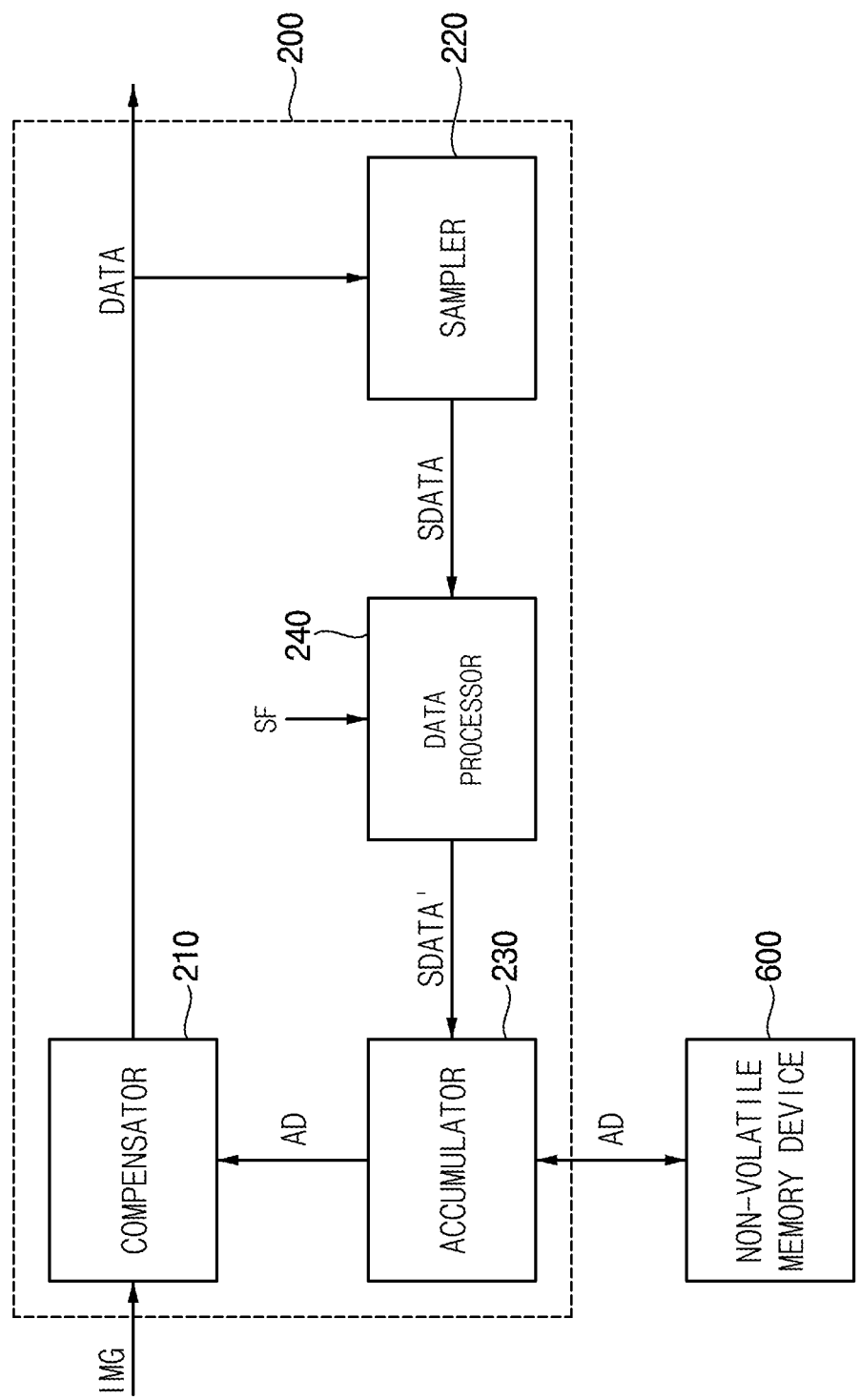
FIG. 15 is a schematic block diagram showing a timing controller and a non-volatile memory device of a display device, according to an embodiment.

FIG. 15 is a schematic block diagram showing a timing controller 200 and a non-volatile memory device 600 of a display device according to embodiments.

Since a display device according to embodiments has a configuration that is substantially identical to the configuration of the display device of FIG. 1 except for application of a scale factor SF, the same reference numerals and reference signs will be used for the same or similar components, and redundant descriptions will be omitted.

In an embodiment and referring to FIG. 15, the timing controller 200 may further include a data processor 240 configured to apply a scale factor SF to the data signal SDATA corresponding to the sampling pixel. For example, the data processor 240 may multiply the data signal SDATA corresponding to the sampling pixel by the scale factor SF.

In an embodiment, the accumulator 230 may generate the deterioration data AD by accumulating the data signal SDATA' corresponding to the sampling pixel to which the scale factor SF is applied.

According to an embodiment, the scale factor SF may be a value obtained by dividing the first driving frequency DF1 by the second driving frequency DF2. Since the number of scans of the first display region AA1 may be obtained by multiplying the number of scans of the second display region AA2 by the value obtained by dividing the first drive frequency DF1 by the second drive frequency DF2, the scale factor SF may be determined as the value obtained by dividing the first driving frequency DF1 by the second driving frequency DF2.

Therefore, in an embodiment, since the scale factor SF is applied to the data signal corresponding to the sampling pixel for the first display region AA1, deterioration of the first display region AA1 driven at a relatively high driving frequency may be appropriately reflected.

Figure 16:
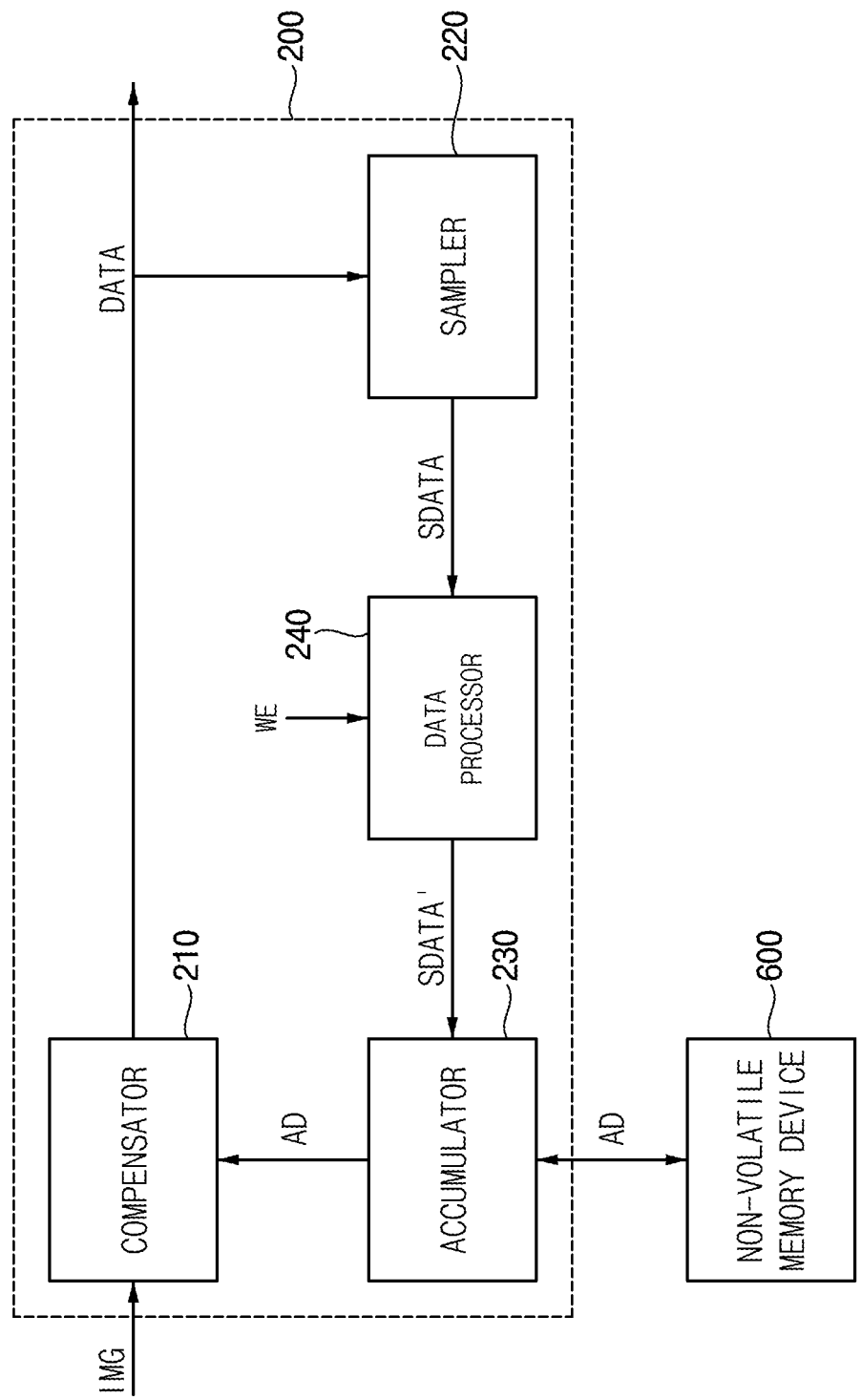
FIG. 16 is a schematic block diagram showing a timing controller and a non-volatile memory device of a display device, according to an embodiment.

FIG. 16 is a schematic block diagram showing a timing controller 200 and a non-volatile memory device 600 of a display device according to embodiments.

Since a display device according to embodiments has a configuration that is substantially identical to the configuration of the display device of FIG. 1 except for application of ±36, the same reference numerals and reference signs will be used for the same or similar components, and redundant descriptions will be omitted.

In an embodiment and referring to FIG. 16, the timing controller 200 may further include a data processor 240 configured to add a weight WE to the data signal SDATA corresponding to the sampling pixel.

In an embodiment, the accumulator 230 may generate the deterioration data AD by accumulating the data signal SDATA' corresponding to the sampling pixel to which the weight WE is added.

According to an embodiment, the weight WE may be gradually increased as a difference between the first driving frequency DF1 and the second driving frequency DF2 increases. Since a difference between the number of scans of the first display region AA1 and the number of scans of the second display region AA2 may be increased as the difference between the first driving frequency DF1 and the second driving frequency DF2 increases, the weight WE may be gradually increased as the difference between the first driving frequency DF1 and the second driving frequency DF2 increases.

Therefore, in an embodiment, since the weight WE is applied to the data signal corresponding to the sampling pixel for the first display region AA1, deterioration of the first display region AA1 driven at a relatively high driving frequency may be appropriately reflected.

Figure 17:
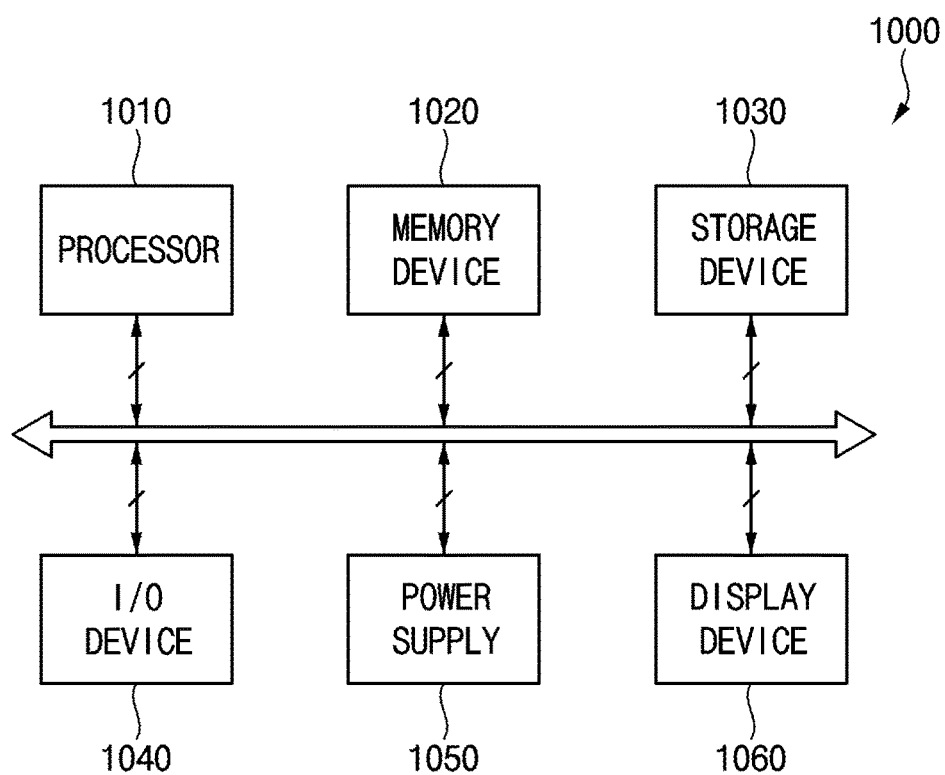
FIG. 17 is a block diagram showing an electronic device, according to an embodiment.
Figure 18:
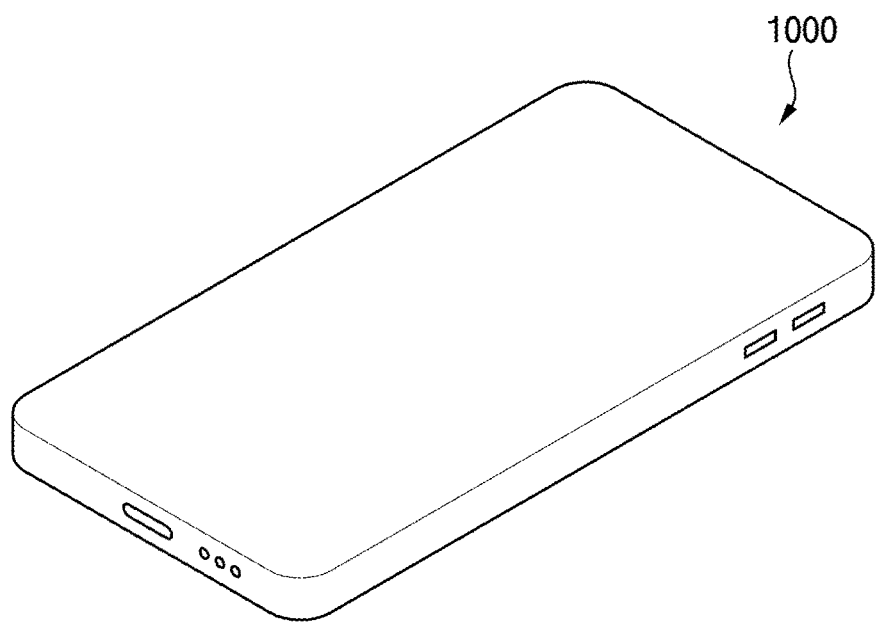
FIG. 18 is a perspective view showing one example in which the electronic device of FIG. 17 is implemented as a smart phone, according to an embodiment.

FIG. 17 is a block diagram showing an electronic device 1000 according to embodiments, and FIG. 18 is a diagram showing one embodiment in which the electronic device 1000 of FIG. 17 is implemented as a smart phone.

In an embodiment and referring to FIGS. 17 and 18, the electronic device 1000 may include a processor 1010, a memory device 1020, a storage device 1030, an input/output (I/O) device 1040, a power supply 1050, and a display device 1060. Here, the display device 1060 may be the display device of FIG. 1. In addition, the electronic device 1000 may further include a plurality of ports for communicating with a video card, a sound card, a memory card, a universal serial bus (USB) device, other electronic devices, etc. In an embodiment, as shown in FIG. 18, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, etc.

In an embodiment, the processor 1010 may perform various computing functions. The processor 1010 may be a microprocessor, a central processing unit (CPU), an application processor (AP), etc. In an embodiment, the processor 1010 may be coupled to other components via an address bus, a control bus, a data bus, etc. Further, the processor 1010 may be coupled to an extended bus such as a peripheral component interconnection (PCI) bus.

In an embodiment, the memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc.

In an embodiment, the storage device 1030 may include a solid state drive (SSD) device, a hard disk drive (HDD) device, a CD-ROM device, etc.

In an embodiment, the I/O device 1040 may include an input device such as a keyboard, a keypad, a mouse device, a touch-pad, a touch-screen, etc., and/or an output device such as a printer, a speaker, etc. In an embodiment, the I/O device 1040 may include the display device 1060.

In an embodiment, the power supply 1050 may provide power for operations of the electronic device 1000. For example, the power supply 1050 may be a power management integrated circuit (PMIC).

In an embodiment, the display device 1060 may display an image corresponding to visual information of the electronic device 1000. Here, the display device 1060 may be an organic light emitting display device or a quantum-dot light emitting display device. However, the display device 1060 is not limited thereto. The display device 1060 may be coupled to other components via the buses and/or other communication links.

In an embodiment, the invention may be applied to a display device and an electronic device including the display device. For example, the invention may be applied to a digital television, a 3D television, a smart phone, a cellular phone, a personal computer (PC), a tablet PC, a virtual reality (VR) device, a home appliance, a laptop, a personal digital assistant (PDA), a portable media player (PMP), a digital camera, a music player, a portable game console, a car navigation system, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims. Moreover, the embodiments or parts of the embodiments may be combined in whole or in part without departing from the scope of the invention.

What is claimed is:

1. A display panel driver which drives a display panel, the display panel driver comprising:
   a compensator configured to generate a compensator data signal by compensating for input image data based on deterioration data;
   a sampler, wherein when a first display region of the display panel is scanned at a first driving frequency and when a second display region of the display panel is scanned at a second driving frequency that is less than the first driving frequency, the sampler is configured to generate a data signal corresponding to a sampling pixel by sampling the compensator data signal at a sampling frequency that is less than or equal to the second driving frequency; and
   an accumulator configured to generate the deterioration data by accumulating the data signal corresponding to the sampling pixel.

2. The display panel driver of claim 1, wherein the sampling frequency is 1/N times the second driving frequency, where N is a positive integer.

3. The display panel driver of claim 1, wherein the sampler is configured to sample the compensator data signal in a normal frame in which the first display region and the second display region are scanned.

4. The display panel driver of claim 1, wherein the sampler is configured to not sample the compensator data signal in a masking frame in which the second display region is not scanned.

5. The display panel driver of claim 1, further comprising:
   a data processor configured to apply a scale factor to the data signal corresponding to the sampling pixel,
   wherein the accumulator is configured to generate the deterioration data by accumulating the data signal corresponding to the sampling pixel to which the scale factor is applied.

6. The display panel driver of claim 5, wherein the scale factor is a value obtained by dividing the first driving frequency by the second driving frequency.

7. The display panel driver of claim 1, further comprising:
   a data processor configured to add a weight to the data signal corresponding to the sampling pixel,
   wherein the accumulator is configured to generate the deterioration data by accumulating the data signal corresponding to the sampling pixel to which the weight is added.

8. The display panel driver of claim 7, wherein the weight is gradually increased as a difference between the first driving frequency and the second driving frequency increases.

9. The display panel driver of claim 1, wherein the sampler is configured to sequentially determine one or more pixels of a panel block of the display panel as the sampling pixel.

10. The display panel driver of claim 1, wherein the sampler is configured to sequentially determine panel block lines of the display panel as a sampling panel block line and to identify at least one or more pixels for each panel block of the sampling panel block line as the sampling pixel.

11. A display device comprising:
    a display panel including a first display region that is scanned at a first driving frequency and a second display region that is scanned at a second driving frequency, wherein the second driving frequency is less than the first driving frequency; and
    a display panel driver configured to generate a data signal by compensating for input image data based on deterioration data, to generate a data signal corresponding to a sampling pixel by sampling the data signal at a sampling frequency that is less than or equal to the second driving frequency, to generate the deterioration data by accumulating the data signal corresponding to the sampling pixel, to generate a data voltage based on the data signal, and to provide the data voltage to the display panel.

12. The display device of claim 11, further comprising:
a non-volatile memory device configured to store the deterioration data, and provide the stored deterioration data to the display panel driver.

13. The display device of claim 11, wherein the display panel driver is configured to sample the data signal in a normal frame in which the first display region and the second display region are scanned.

14. The display device of claim 11, wherein the display panel driver is configured to not sample the data signal in a masking frame in which the second display region is not scanned.

15. The display device of claim 11, wherein the display panel driver is configured to apply a scale factor to the data signal corresponding to the sampling pixel for the first display region and to generate the deterioration data by accumulating the data signal corresponding to the sampling pixel to which the scale factor is applied.

16. The display device of claim 11, wherein the display panel driver is configured to add a weight to the data signal corresponding to the sampling pixel for the first display region and to generate the deterioration data by accumulating the data signal corresponding to the sampling pixel to which the weight is added.

17. The display device of claim 11, wherein the display panel further includes:
a third display region that is driven at a third driving frequency that is less than the second driving frequency,
wherein the sampling frequency is less than or equal to the third driving frequency.

18. The display device of claim 17, wherein the sampling frequency is 1/N times the third driving frequency, where N is a positive integer.

19. The display device of claim 17, wherein the display panel driver is configured to sample the data signal in a normal frame in which the first display region, the second display region, and the third display region are scanned.

20. The display device of claim 17, wherein the display panel driver is configured to not sample the data signal in a first masking frame in which the second display region and the third display region are not scanned and in a second masking frame in which the second display region is scanned and the third display region is not scanned.

* * * * *